US006144216A

United States Patent [19]

Kajiwara et al.

[11] Patent Number: 6,144,216

[45] **Date of Patent: *Nov. 7, 2000**

[54] ELECTRIC CONTACT APPARATUS FOR INSPECTING A LIQUID CRYSTAL DISPLAY PANEL

[75] Inventors: Yasushi Kajiwara; Michihiko Tezuka, both of Kawaguchi, Japan

[73] Assignee: Enplas Corporation, Japan

[ * ] Notice: This patent issued on a continued prosecution application filed under 37 CFR 1.53(d), and is subject to the twenty year patent term provisions of 35 U.S.C. 154(a)(2).

[21] Appl. No.: 08/643,277

[22] Filed: May 8, 1996

Related U.S. Application Data

[63] Continuation of application No. 08/415,739, Apr. 3, 1995, abandoned.

[30] Foreign Application Priority Data

Apr. 1, 1995 [JP] Japan .................................... 6-087363

[51] Int. Cl.$^{7}$ ...................................................... G01R 31/00

[52] U.S. Cl. ...................... 324/770; 324/765; 324/158.1; 324/73.1; 439/482; 439/66; 439/86; 439/91; 439/521; 359/49; 359/59; 359/62

[58] Field of Search .................................... 324/770, 765, 324/158.1, 73.1; 439/482, 66, 86, 91, 521; 359/49, 59, 62

[56] References Cited

U.S. PATENT DOCUMENTS

| | | | |
|---|---|---|---|
| 3,680,037 | 7/1972 | Nellis et al. | 439/66 |
| 4,118,092 | 10/1978 | Sado et al. | 439/66 |
| 4,202,588 | 5/1980 | Dalamangas et al. | 439/66 |
| 4,927,368 | 5/1990 | Shino | 439/86 |
| 5,358,412 | 10/1994 | Maurinus et al. | 439/66 |
| 5,378,982 | 1/1995 | Feigenbaum et al. | 324/770 |
| 5,459,594 | 10/1995 | Nakanishi et al. | 324/770 |
| 5,543,729 | 8/1996 | Henley | 324/770 |
| 5,636,996 | 6/1997 | Johnson et al. | 439/66 |

*Primary Examiner*—Vinh P. Nguyen
*Attorney, Agent, or Firm*—Fish & Richardson P. C.

[57] ABSTRACT

An electric contact apparatus has a flexible contact sheet 13. A plurality of conductive elements 14 are provided on a front side of the flexible contact sheet 13 and are arranged in parallel with each other along the direction of arrangement of electrodes 4 arranged on an insulating substrate 2 of a liquid crystal display panel 1 so as to be brought into contact with the electrodes 4, respectively. An internally sealed elastic tube 17 is supported in a groove 18 formed on one side of a pressing plate 11 and extends along the direction of arrangement of the conductive elements 14 so as to press a part of each contact region between the conductive elements 14 and the electrodes 4.

14 Claims, 5 Drawing Sheets

F/G. 7
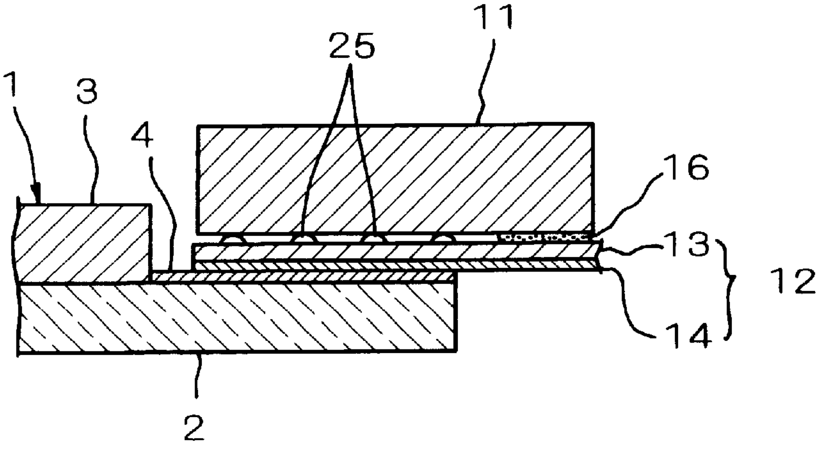
F/G. 8
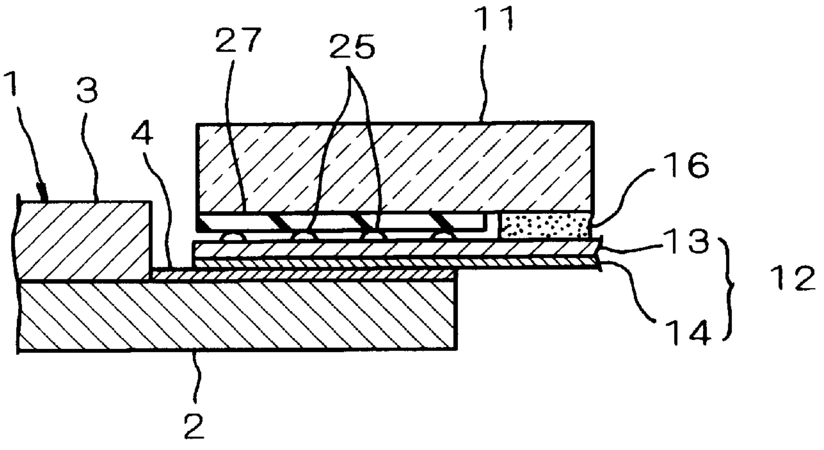
F/G. 9A F/G. 9B F/G. 9C
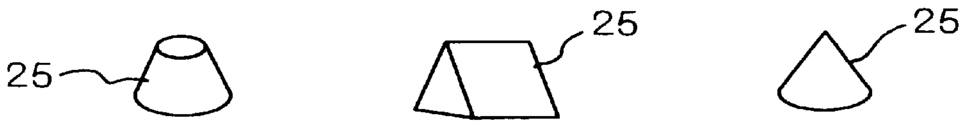

ELECTRIC CONTACT APPARATUS FOR INSPECTING A LIQUID CRYSTAL DISPLAY PANEL

This is a continuation of application Ser. No. 08/415,739, filed Apr. 3, 1995, now abandoned.

BACKGROUND OF THE INVENTION

1. Field of the Invention

The present invention relates to an electric contact apparatus for inspecting a liquid crystal display panel, more specifically relates to an electric contact apparatus for supplying driving signals for inspecting a liquid crystal display panel into electrodes arranged on an insulating substrate of the liquid crystal display panel.

2. Description of Related Art

In general, a conventional liquid crystal display apparatus comprises a liquid crystal display panel and a plurality of flexible printed circuit boards. The liquid crystal display panel comprises an insulating substrate made of glass, a display portion formed on the insulating substrate and including therein a plurality of display elements, and a plurality of electrodes arranged on the insulating substrate and connected respectively to the display elements. On the other hand, each of the flexible printed circuit boards comprises a flexible insulating sheet, a plurality of conductive terminals arranged on the insulating sheet, and an integrated circuit (IC) device mounted on the insulating sheet and connected to the conductive terminals. Driving signals for driving the liquid crystal display panel are generated from the IC device and then supplied into the display elements of the liquid crystal display panel through the conductive terminals and the electrodes. Generally, the liquid crystal display apparatus has been fabricated by securing the flexible printed circuit boards to the insulating substrate of the liquid crystal display panel by heat sealing or the like for electrically connecting the conductive terminals to the electrodes of the liquid crystal display panel.

Conventionally, the display operation of this type of liquid crystal display apparatus has been inspected by supplying certain driving signals generated from the IC devices into the display elements of the liquid crystal display panel and inspecting the state of operation or the quality of display of the display portion of the liquid crystal display panel at that time by the naked eye. In the case of such a liquid crystal display apparatus, the display elements in the display portion of the liquid crystal display panel can be easily driven by connecting the flexible printed circuit boards heat-sealed on the insulating substrate to an external driving apparatus through connectors. However, where a defect is found during the inspection of the liquid crystal display apparatus, even in a case where the cause of that defect resides only in the liquid crystal display panel, the flexible printed circuit boards and IC devices mounted on the flexible printed circuit boards have to be treated as defective parts together with the liquid crystal display panel, resulting in the increase of manufacturing cost. Accordingly, it is desirable to inspect the state of operation or the quality of display of the liquid crystal display panel before the flexible printed circuit boards are fixed to the insulating substrate of the liquid crystal display panel.

For this purpose, an electric contact apparatus having a plurality of contact elements for establishing direct contact with the electrodes on the insulating substrate of the liquid crystal display panel and for supplying driving signals for inspection onto the electrodes has been proposed. A conventional electric contact apparatus has a plurality of needle-like probes or a plurality of loop-like wire probes spring-biased in the direction of projection as the contact elements.

In recent years, along with the increasing density of display elements in liquid crystal display panels, the electrodes arranged on the insulating substrate of the liquid crystal display panels and the pitches between the electrodes have been made increasingly narrower and the number of the electrodes has become extremely large. However, there is a limit in the dimensions and machining precision to how far the needle-like probes or the loop-like wire probes can be miniaturized and provided in an insulating support to match with the pitch of the electrodes of the liquid crystal display panel. Also, miniaturized needle-like probes or loop-like wire probes become very weak and therefore become insufficient in durability and, at the same time, their handling becomes very difficult. The risk of poor conduction or short-circuits due to deformation of these probes is increased. Further, an expensive precision machining technique is necessary for the fabrication and assembly of these fine probes and the connection of the lead wires to the probes. Therefore, an electric contact apparatus provided with the same number of probes as the number of the electrodes of the liquid crystal display panel becomes very expensive.

Note that, if the display operation of the liquid crystal display panel is inspected in units of driving modules, the number of the probes of the electric contact apparatus can be reduced, but it is necessary to repeat the inspection for every driving module, and therefore much labor and time are required, and the inspection efficiency is considerably lowered. Also, the entire display portion of the liquid crystal display panel cannot be simultaneously made to operate by the method of repeating the inspection for every driving module, so it becomes difficult to identify the existence of defects such as uneven color, uneven luminance, etc. in the entire display portion of the liquid crystal display panel.

SUMMARY OF THE INVENTION

It is therefore an object of the present invention to provide an electric contact apparatus for inspecting a liquid crystal display panel which can be produced at a low cost and makes it possible to easily inspect the state of operation or the quality of display of the entire display portion of the liquid crystal display panel with an increased efficiency.

According to the present invention, it is provided an electric contact apparatus for inspecting a liquid crystal display panel having a plurality of electrodes arranged on an insulating substrate, comprising:

at least one flexible contact sheet having front and back sides and also having at the front side thereof a plurality of conductive elements which are arranged in parallel with each other along the direction of arrangement of the electrodes so as to be brought into contact with the electrodes, respectively; and pressing means for pressing a part of the flexible contact sheet against the insulating substrate to contact the conductive elements with the electrodes, the pressing means including a pressing plate and at least one internally sealed elastic tube which is supported on one side of the pressing plate and extends along the direction of arrangement of the conductive elements so as to press a part of each contact region between the conductive elements and the electrodes.

In the electric contact apparatus according to the present invention, the conductive elements arranged on the front side of the flexible contact sheet are used as the contact terminals to be brought into contact with the electrodes on the insulating substrate of the liquid crystal display panel. Therefore contact terminals of a fine pitch distance corresponding to the fine pitch of the electrodes of the liquid crystal display panel can be formed at a low cost and with a high precision. Accordingly, an electric contact apparatus provided with a number of contact terminals corresponding to the number of the electrodes of the liquid crystal display panel can be easily realized. Also, the conductive elements of the flexible contact sheet are resistant to short-circuiting, poor conduction, etc. due to deformation and breakage and therefore the handling property and durability are improved.

Further, a part of each of the contact regions between the conductive elements and the electrodes can be concentratedly pressed by the pressing plate through the elastic tube, and therefore a large contact pressure can be produced in the contact region between the conductive elements and the electrodes by a small entire pressing force.

In addition, the elastic tube extended in the direction of arrangement of the conductive elements has an internally sealed construction, and therefore a uniform contact pressure can be ensured in the contact regions between the respective conductive elements and the electrodes by utilizing the inner pressure of the elastic tube. Namely, the contact pressure between the respective conductive elements and the electrodes can be made uniform with a higher precision in comparison with the case of using an elastic tube with an open internal portion.

Preferably, the pressing plate is formed with a groove extending along the direction of arrangement of the conductive elements and wherein the elastic tube is accommodated in the groove so that a part thereof is projected from the one side of the pressing plate toward the flexible contact sheet. In this construction, a part of the elastic tube is held in the groove of the pressing plate at the time of pressing of the flexible printed circuit board, and therefore the position of the flexible tube is stabilized. Accordingly the conductive elements arranged on the flexible contact sheet and the electrodes can be stably brought into contact with each other.

Preferably, the elastic tube is connected to pressure adjusting means for adjusting an inner pressure of the elastic tube. In this construction, the inner pressure of the elastic tube can be adjusted to increase or decrease at the time of the contact between the conductive elements of the flexible contact sheet and the electrodes on the insulating substrate. Therefore, even in a case where dust or dirt, which become the cause of poor conduction, adheres to the contact surface between the conductive elements and the electrodes, it becomes possible to increase or decrease the inner pressure of the elastic tube to secure a further larger contact pressure which can overcome the physical or electrical obstacle due to the dust or other deposited substance between the conductive elements and the electrodes or to conversely weaken the contact pressure to disperse the contact pressure around the dust or other deposited substances and thereby to secure a sufficient contact region. Accordingly, it is possible to prevent poor conduction between the conductive elements and the electrodes due to dust or other deposited substances and to surely perform inspect the display operation of the liquid crystal display panel per se.

Preferably, the pressing means comprises two internally sealed elastic tubes which are adjacent to each other and extend along the direction of arrangement of the conductive elements within the groove of the pressing plate so that a part of each is projected from the pressing plate toward the flexible contact sheet and presses a part of each contact region between the conductive elements and the electrodes. In this case, preferably, the elastic tubes are connected to pressure adjusting means for adjusting an inner pressure of each of the elastic tubes. In this construction, at the time of the pressing of the flexible contact sheet by the pressing plate, the inner pressures of the two elastic tubes held in parallel in the groove of the pressing plate can be alternately changed so as to produce a so-called "wiping function" in the contact region between the conductive elements and the electrodes. Accordingly, the conductive elements and the electrodes can be made more reliably conductive.

Preferably, the number of the flexible contact sheets corresponds to the number of driving modules of the liquid crystal display panel, and a number of the conductive elements corresponding to the number of electrodes for each driving module are formed on each flexible contact sheet. In this construction, use can be made of a flexible contact sheet having the same number of conductive elements at the same portion as the number of the electrodes of a driving module of the liquid crystal display panel, and therefore it is possible to use standard flexible contact sheets and provide contact apparatuses of various sizes used for liquid crystal display panels having different sizes, that is, liquid crystal display panels having different numbers of driving modules and different numbers of the electrodes as a whole, at a low cost.

Preferably, a rough portion including convex portions of a finer pitch than the pitch of arrangement of the conductive elements is formed on an outer surface of the elastic tube in a region abutting against the flexible contact sheet. In this construction, it is possible to concentrate the pressing force by the pressing plate at the convex portions on the outer surface of the elastic tube to make them act upon the back side of the flexible contact sheet, and therefore a larger contact pressure can be ensured between the conductive elements and the electrodes by a smaller pressing force and, further, a reduction of the weight of the contact apparatus becomes possible. Also, in a case where dust or the like adheres between the outer surface of the elastic tube and the flexible contact sheet, the flexible contact sheet can be pressed by the convex portions of the outer surface of the elastic tube while avoiding that dust etc., and therefore the contact pressure between the conductive elements and the electrodes can be stabilized.

Preferably, the pressing plate is made of a material having substantially the same coefficient of linear expansion as that of the insulating substrate of the liquid crystal display panel and wherein the flexible contact sheet is fixed to the pressing plate in the vicinity of the elastic tube. In this construction, the back side of the flexible contact sheet is fixed to the pressing plate in the vicinity of the elastic tube, and therefore by positioning the pressing plate with respect to the insulating substrate, the positioning of the conductive elements of the flexible contact sheet with respect to the electrodes on the insulating substrate can be easily and quickly carried out.

Also, the pressing plate is made of a material having substantially the same coefficient of linear expansion as that of the insulating substrate of the liquid crystal display panel, and therefore when the environmental temperature at the time of the inspection of the display operation or the quality of display of the liquid crystal display panel is changed, it is possible to make the pitch of the conductive elements of the flexible contact sheet fixed to the pressing plate substantially follow the change of the pitch of the electrodes on the insulating substrate of the liquid crystal display panel and therefore the electrical conduction between the conductive elements and the electrodes can be maintained. Accordingly, the display operation or the quality of display of the liquid crystal display panel can be inspected under varying environmental temperatures and can be carried out without obstacle.

Preferably, a plurality of convex portions are provided on the back side of the flexible contact sheet at positions corresponding to the backs of the conduct elements along respective contact regions between the conductive elements and the electrodes. In this construction, the convex portions positioned at the back sides of the conductive elements of the flexible contact sheet can be concentratedly pressed by the elastic tube held by the pressing plate at the time of the pressing by the pressing plate. Therefore, it is possible to more reliably bring the conductive elements of the flexible contact sheet and the electrodes on the insulating substrate of the liquid crystal display panel into contact with each other.

According to the present invention, it is also provided an electric contact apparatus for inspecting a liquid crystal display panel having a plurality of electrodes arranged on an insulating substrate, comprising:

a flexible contact sheet having front and back sides and also having at the front side thereof a plurality of conductive elements which are arranged in parallel with each other along the direction of arrangement of the electrodes so as to be brought into contact with the electrodes, respectively;

a pressing plate having a pressing surface for pressing the flexible contact sheet against the insulating substrate to contact the conductive elements with the electrodes; and a plurality of convex portions arranged on the back side of the flexible contact sheet at positions corresponding to the backs of the conduct elements along the respective contact regions between the conductive elements and the electrodes, the convex portions and the pressing surface of the pressing plate being made of first and second materials, respectively, one of the first and second materials being more easily elastically deformed than the other.

In the above-mentioned construction of the contact apparatus, the conductive elements arranged on the front side of the flexible contact sheet are used as the contact terminals to be brought into contact with the electrodes on the insulating substrate of the liquid crystal display panel, and therefore contact terminals of a fine pitch distance corresponding to the fine pitch of the electrodes of the liquid crystal display panel can be formed at a low cost and with a high precision. Accordingly, an electric contact apparatus provided with a number of contact terminals corresponding to the number of the electrodes of the liquid crystal display panel can be easily realized. Also, short-circuits, poor conduction, etc. due to deformation or breakage hardly ever occur in the conductive elements of the flexible contact sheet, and therefore the handling property and the durability are improved.

Further, the flexible contact sheet is pressed by the pressing plate via the convex portions provided on the back side of the flexible contact sheet and the convex portions are positioned at the backs of the respective contact regions between the conductive elements and the electrodes. Therefore, it is possible to make the pressing force by the pressing plate act by concentrating the same in the contact regions between the conductive elements and the electrodes. Accordingly, a big contact pressure can be produced in the contact regions between the conductive elements and the electrodes with a small entire pressing force.

In addition, one of each convex portion and the pressing surface of the pressing plate is more easily elastically deformed than the other, and therefore a uniform contact pressure can be ensured in the contact regions between the conductive elements and the electrodes by utilizing the elasticity of the convex portions or the pressing surface of the pressing plate.

Preferably, in the case that the first material of the convex portions is more easily elastically deformed than the second material, the entire pressing plate is made of the second material which has substantially the same coefficient of linear expansion as that of the insulating substrate of the liquid crystal display panel. In this case, preferably, the flexible contact sheet is fixed to the pressing plate in the vicinity of the region of arrangement of the convex portions. According to this construction, an electric contact apparatus ensuring a uniform contact pressure in the contact regions between the conductive elements and the electrodes can be realized easily and at a low cost by utilizing the elasticity of the convex portions.

Also, the pressing plate is made of a material having almost the same coefficient of linear expansion as that of the insulating substrate of the liquid crystal display panel and the flexible contact sheet is fixed to the pressing plate in the vicinity of the region of arrangement of the convex portions, i.e., the vicinity of the contact regions of the conductive elements and the electrodes, and therefore when the environmental temperature at the time of the display inspection of the liquid crystal display panel is changed, the pitch of the conductive elements of the flexible contact sheet fixed to the pressing plate can be made to substantially follow the change of the pitch of the electrodes on the insulating substrate of the liquid crystal display panel, and the electrical conduction between the conductive elements and the electrodes can be maintained. Accordingly, the display operation or quality of the liquid crystal display panel under different environmental temperature can be inspected without obstacle.

Preferably, in the case that the second material of the pressing surface of the pressing plate is more easily elastically deformed than the first material of the convex portions, the pressing plate comprises a base plate portion made of a material having substantially the same coefficient of linear expansion as that of the insulating substrate of the liquid crystal display panel, and an elastic film which is made of the second material and is fixed to the base plate portion at a region corresponding to the region of arrangement of the convex portions, and the flexible contact sheet is fixed to the base plate portion of the pressing plate in the vicinity of the elastic film. According to this construction, when the environmental temperature at the time of the display inspection of the liquid crystal display panel is changed, the pitch of the conductive elements of the flexible contact sheet fixed to the base plate portion of the pressing plate can be made to substantially follow the change of the pitch of the electrodes on the insulating substrate of the liquid crystal display panel, and the electrical conduction state between the conductive elements and the electrodes can be maintained. Accordingly, the display operation or the quality of display of the liquid crystal display panel under varying environmental temperatures can be inspected without obstacle.

Preferably, in the case that the second material of the pressing surface of the pressing plate is more easily elastically deformed than the first material of the convex portions, the flexible contact sheet and the convex portions are formed in one piece. According to this construction, the number of manufacturing processes for the flexible contact sheet can be reduced in comparison with the case where the convex portions are attached by adhesion or the like to the flexible contact sheet, and thus the manufacturing costs can be reduced.

Further objects, features and advantages of the present invention will become apparent from the following description of the preferred embodiments of the present invention as illustrated in the accompanying drawings.

BRIEF DESCRIPTION OF THE DRAWINGS

FIG. 7 is a longitudinal cross-sectional view of principal parts of the contact apparatus showing an embodiment where the convex portions of the flexible contact sheet shown in FIGS. 6A to 6C are made of a material which is more easily elastically deformed than the pressing surface of the pressing plate;

FIG. 8 is a longitudinal cross-sectional view of principal parts of the contact apparatus showing an embodiment where the convex portions of the flexible contact sheet shown in FIGS. 6A to 6C are made of a material which is harder to elastically deform than the pressing surface of the pressing plate;

FIGS. 9A, 9B, and 9C are perspective views showing examples of modification of the shape of the convex portions provided on the back side of the insulating film of the flexible contact sheet;

DESCRIPTION OF THE PREFERRED EMBODIMENTS

Figure 1:
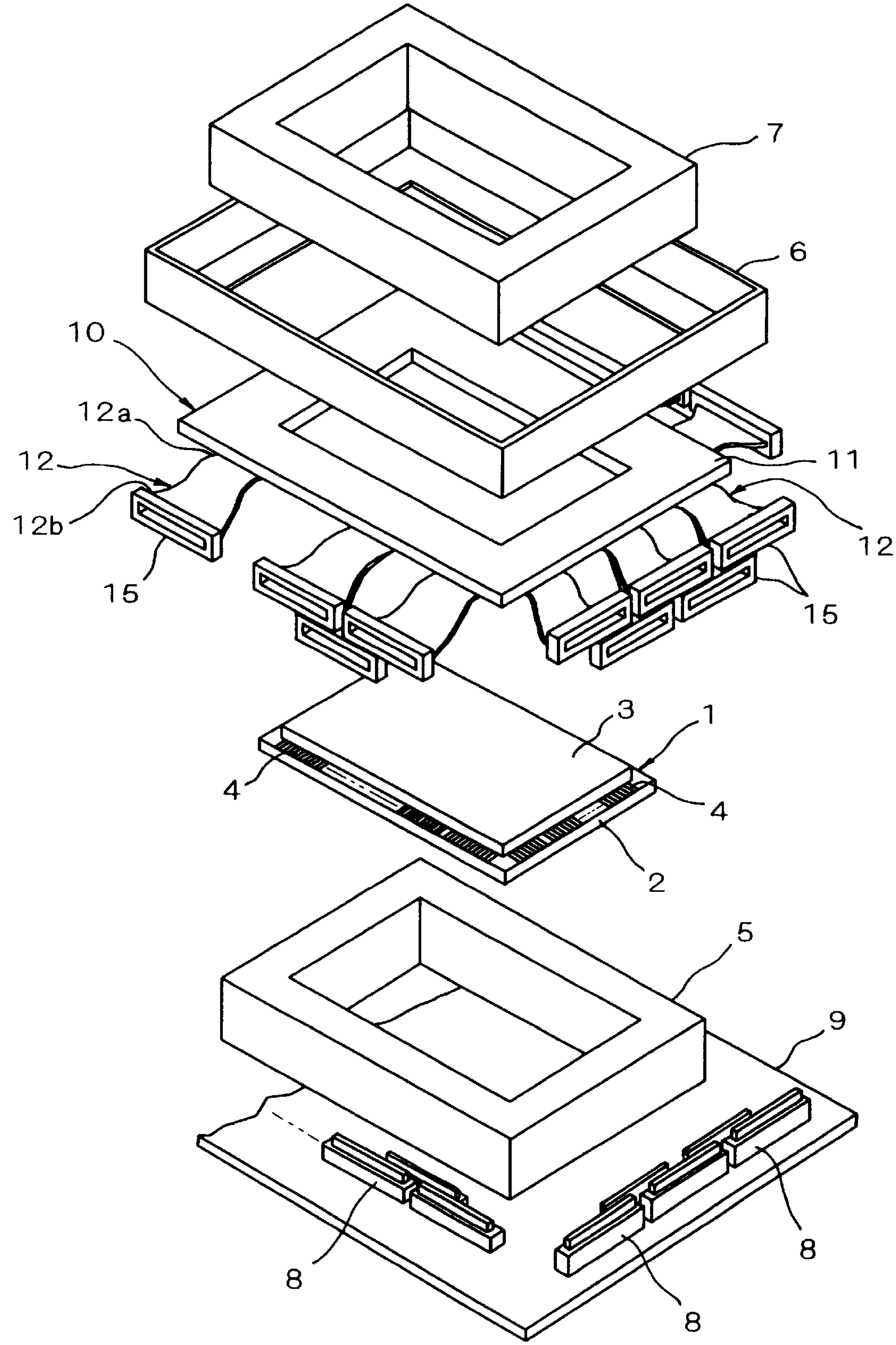
FIG. 1 is an exploded perspective view of an electric contact apparatus and parts of surrounding equipment showing am embodiment of the present invention using an elastic tube.

Preferred embodiments of the present invention will be explained hereinafter referring to the drawings.

Figure 2:
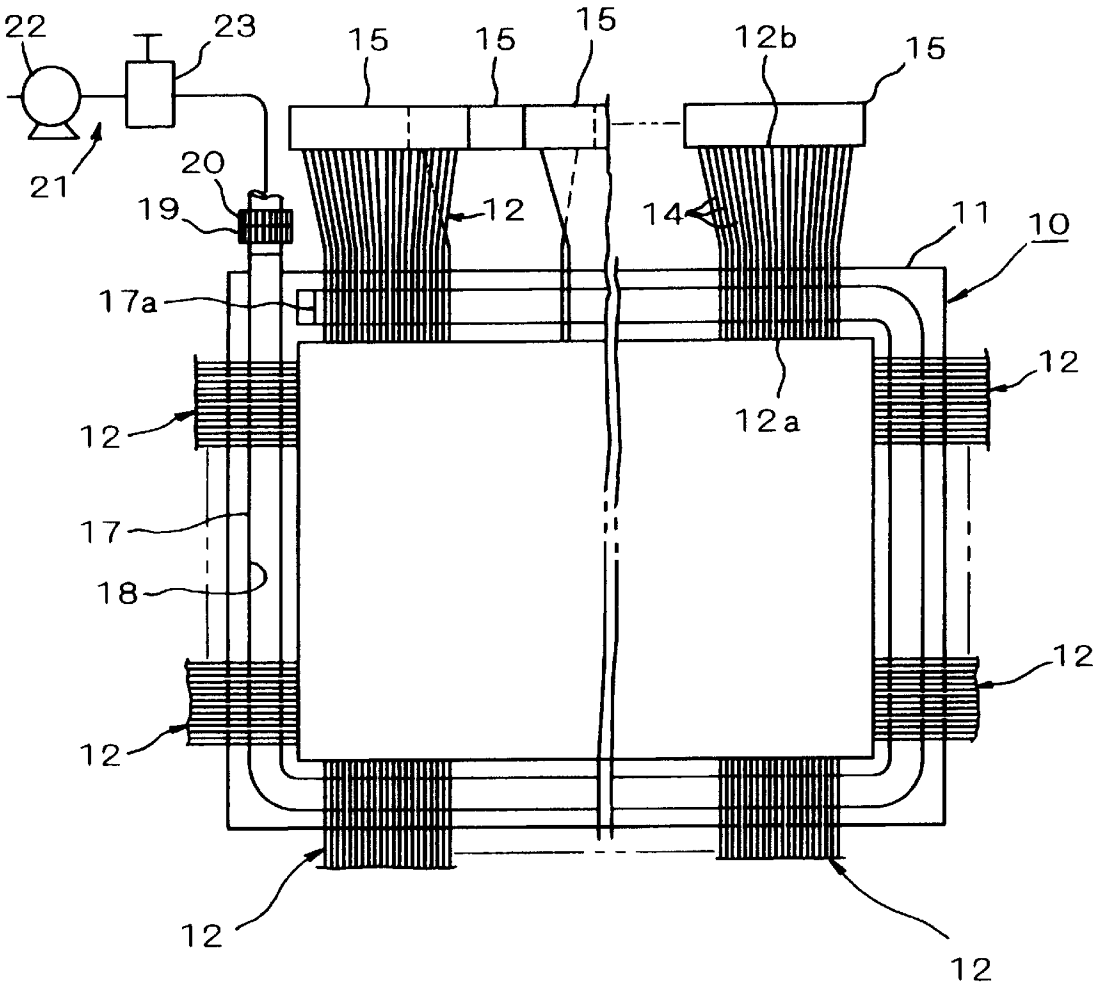
FIG. 2 is a schematic bottom view of the contact apparatus shown in FIG. 1.
Figure 3:
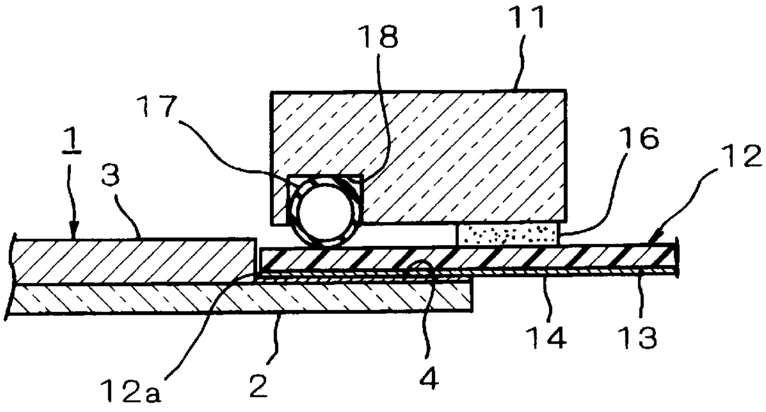
FIG. 3 is a longitudinal cross-sectional view of principal parts of the contact apparatus shown in FIG. 1.

FIG. 1 to FIG. 3 show one embodiment of the present invention. Referring first to FIG. 1, a liquid crystal display panel 1 has a transparent insulating substrate 2 made of for example glass, a liquid crystal display portion 3 is formed on this insulating substrate 2, and a plurality of electrode films or electrodes 4, such as transparent indium-tin-oxide (ITO) electrodes, connected to the display elements (not illustrated) in the display portion are laminated and arranged on the insulating substrate 2 along the periphery of the liquid crystal display portion 3. The liquid crystal display panel 1 is held on a base stand 5 of a rectangular frame shape so that it can be positioned. Where the liquid crystal display panel 1 is a transparent type liquid crystal display panel, a planar light source (not illustrated) illuminating the back side of the liquid crystal display panel 1 is arranged inside the base stand 5.

In FIG. 1, reference numeral 10 indicates an electric. contact apparatus for inspecting the liquid crystal display panel 1. The contact apparatus 10 has a pressing plate 11 shaped as a rectangular frame and a plurality of flexible printed circuit boards (referred to as FPCs, hereinafter) 12 as the flexible contact sheets which are attached to the pressing plate 11. Each flexible printed circuit board (referred to as FPC, hereinafter) 12 has an flexible insulating film 13 and a plurality of elongate films or patterns 14 which are laminated and arranged as the conductive elements on a front side thereof as shown in FIG. 3. The number of the conductive films 14 in each FPC 12 corresponds to the number of the electrodes 4 for each driving module. The total number of the conductive films 14 coincides with the total number of the electrodes 4. Note that, although the illustration is omitted, preferably an upper surface of this is covered by a cover film except at the connection section at the two ends of the conductive elements 14 formed on a front side of the insulating film 13.

As shown in FIG. 1, a connector 15 is attached to one end portion of the FPC 12. The connector 15 can be connected to a contact 8 provided on the printed circuit board 9. One end portion of each conductive film 14 can be connected to the inspection panel driving apparatus (not shown) via the connector 15 and the contact 8. Also, as schematically shown in FIGS. 2 and 3, the FPCs 12 are annularly arranged along the inner circumference of the pressing plate 11 so that the other end portions of the conductive films 14 are arranged at the same pitch as that of the electrodes 4 on the insulating substrate 2 of the liquid crystal display panel 1 and are fixed to the pressing plate 11 by an adhesive 16 (refer to FIG. 3). The pressing plate 11 is made of a material having substantially the same coefficient of linear expansion as that of the insulating substrate 2 of the liquid crystal display panel 1, for example, is made of glass. A supporting frame 6 for adjusting the position, a display window frame 7 acting also as a weight, etc. can be laid over the pressing plate 11.

As shown in FIGS. 2 and 3, an elastic tube 17 having a substantially cylindrical cross-section and extending in the direction of arrangement of the conductive films 14 while abutting against a part of the back sides of the FPCs 12 is held on the pressing plate 11. The position and the size of the elastic tube 17 are set so that it presses against a part of the distances of contact between the conductive films 14 and the electrodes 4. It is also possible for the elastic tube 17 to be bonded onto the flat pressing surface of the pressing plate 11, but in this embodiment, a concave groove 18 substantially annularly extending along the inner circumferential edge of the pressing plate 11 is formed in the pressing plate 11, and the elastic tube 17 is held in the concave groove 18 so that a part thereof is projected from the pressing plate 11. Note that, the FPCs 12 are fixed to the pressing plate 11 at their back side by the above-described adhesive 16 in the vicinity of the elastic tube 17.

It is also possible for the elastic tube 17 having the internally sealed construction to have a structure in which the two ends are sealed, but in this embodiment, one end 17*a* of the elastic tube 17 is sealed and a tube connector 19 provided with a stopper valve (not illustrated) in the internal portion is attached to the other end to give the elastic tube 17 an internally sealed construction. Also, the tube connector 19 can be connected to a pressure adjustment device 21 comprising an air compressor 22, a pressure adjustment valve 23, etc. via a connector 20, and the air pressure of the internal portion of the elastic tube 17 can be adjusted by this pressure adjustment device 21.

In an electric contact apparatus 10 having the above-described structure, the conductive films or elements 14 arranged on the front side of the insulating film 13 of the FPCs 12 are used as the contact terminals to be brought into contact with the electrodes 4 on the insulating substrate 2 of the liquid crystal display panel 1, and therefore contact terminals of a fine pitch distance corresponding to the fine pitch of the electrodes 4 of the liquid crystal display panel 1 can be formed at a low cost and with a high precision. Accordingly, an electric contact apparatus provided with a number of contact terminals corresponding to the number of the electrodes of the liquid crystal display panel 1 can be easily realized. Also, the conductive films 14 of the FPC 12 are resistant to short-circuits, poor conduction, etc. due to deformation and breakage, and therefore the handling property and the durability are improved.

Further, at the time of the pressing by the pressing plate 11, parts of the distances of contact between the conductive films 14 and the electrodes 4 can be concentratedly pressed by the elastic tube 17, and therefore a great contact pressure can be produced in the contact regions between the conductive films 14 and the electrodes 4 by a small pressing force.

In addition, since the elastic tube 17 extended in the direction of arrangement of the electrically conductive films 14 has an internally sealed construction, a uniform contact pressure can be ensured in the contact regions between the conductive films 14 and the electrodes 4 by utilizing the inner pressure of the elastic tube 17. Namely, the contact pressure between the conductive films and the electrodes can be made uniform with a higher precision compared with a case where an elastic tube having an opened internal portion is used.

Also, since the elastic tube 17 is held in the concave groove 18 formed in the pressing plate 11, a part of the elastic tube 17 is held in the concave groove 18 at the time of the pressing of the FPCs 12 and the position becomes stable, and therefore the conductive films 14 and the electrodes 4 can be stably brought into contact with each other.

Also, the inner pressure of the elastic tube 17 can be adjusted to increase or decrease at the time of the contact between the conductive films 14 of the FPCs 12 and the electrodes 4 on the insulating substrate 2, and therefore even in a case where dust or dirt, which become the cause of poor conduction, adheres to the contact surface of the conductive films 14 and the electrodes 4, by increasing or decreasing the inner pressure of the elastic tube 17, it becomes possible to secure a further larger contact pressure which can overcome the physical or electrical obstacle due to the dust or other deposited substance between the conductive films 14 and the electrodes 4 or conversely weaken the contact pressure to disperse the contact pressure around the dust or other deposited, substance and thereby secure a sufficient contact region. Accordingly, the display operation of the liquid crystal display panel 1 per se can be reliably inspected by preventing poor conduction between the conductive films 14 and the electrodes 4 due to the dust or other deposited substances.

Further, an FPC 12 having the same number of conductive films at the same number of conductive films at the same portion as the number of the electrodes of a driving module of the liquid crystal display panel can be used, and therefore it is possible to use standard FPCs 12 and provide contact apparatuses of various sizes used for liquid crystal display panels having different sizes, that is, liquid crystal display panels having different numbers of driving modules and different numbers of the electrodes as a whole, at a low cost.

Also, in an electric contact apparatus having the above-described structure, the back side of the FPC 12 is tightly fixed to the pressure plate 11 in the vicinity of the elastic tube 17, and therefore the positioning of the conductive films 14 with respect to the electrodes 4 on the insulating substrate 2 can be easily and quickly carried out by the positioning of the pressing plate 11 with respect to the insulating substrate 2.

Further, the pressing plate 11 is made of a material having almost the same coefficient of linear expansion as that of the insulating substrate 2 of the liquid crystal display panel 1, and therefore when the environmental temperature at the time of the display inspection of the liquid crystal display panel 1 is changed, the pitch of the conductive films 14 of the FPC 12 tightly fixed to the pressing plate 11 can be made to substantially follow the change of pitch of the electrodes 4 on the insulating substrate 2 of the liquid crystal display panel 1, and the conduction between the conductive films 14 and the electrodes 4 can be held. Accordingly, the display operation of the liquid crystal display panel 1 under different environmental temperatures can be inspected without obstacle.

Figure 4A:
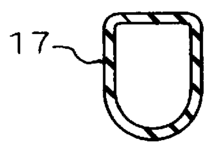
FIGS. 4A and 4B are cross-sectional views showing examples of modification of the cross-sectional shape of the elastic tube used in the contact apparatus.

As mentioned above, the elastic tube 17 of the above-described embodiment has a substantially cylindrical cross-section, but is not restricted to this. For example, as shown in FIG. 4A, it is also possible for the side held by the pressing plate 17 to be given a squared off cross-sectional shape and for the cross-sectional shape on the side abutting against the FPC 12 to be constituted as a convex curve.

Figure 4B:
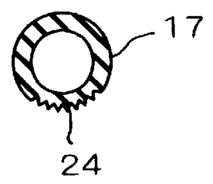

Further, as shown in FIG. 4B, it is also possible for the elastic tube 17 to be given a rough portion with convex portions having a finer pitch than the pitch of arrangement of the conductive films 14 at least at the outer surface part abutting against the FPC 12. It is also possible for the convex portions of the rough portion 24 to be extended in the longitudinal direction of the elastic tube 17 or extended in a spiral direction intersecting each other. When providing such a rough portion 24, the pressing force by the pressing plate 11 can be concentrated at the convex portions of the outer surface of the elastic tube 17 to make these act upon the back side of the FPC 12, and therefore a large contact pressure can be ensured between the conductive films 14 and the electrodes 4 by a smaller pressing force, and a further reduction of weight of the contact apparatus 10 becomes possible. Also, where dust etc. adheres between the outer surface of the elastic tube 17 and the FPC 12, the FPC 12 can be pressed by the convex portions of the rough portion 24 of the outer surface of the elastic tube 17 avoiding the dust etc., and therefore the contact pressure between the conductive films 14 and the electrodes 4 can be made more stable.

Figure 5A:
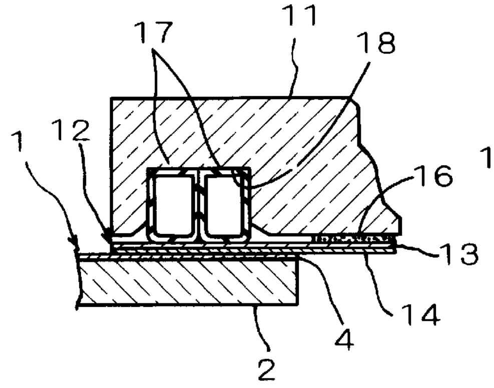
FIG. 5A is a longitudinal cross-sectional view of principal parts of another embodiment of the present invention using two elastic tubes, showing the state immediately before the pressing is started.
Figure 5B:
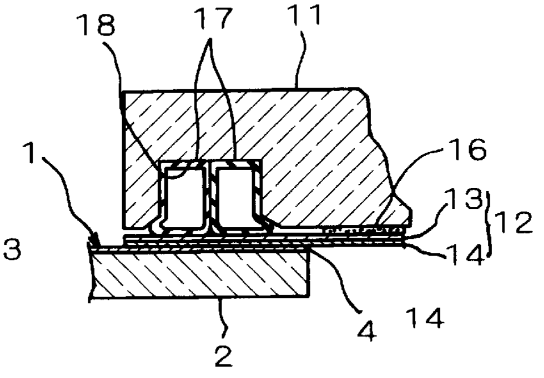
FIG. 5B is a longitudinal cross-sectional view of principal parts of the embodiment shown in FIG. 5B, showing the state of the deformation of the elastic tubes at the time of the pressing.

FIGS. 5A and 5B shows examples of modifications of the elastic tube 17 and the pressing plate 11. As shown in FIG.

5A, a concave groove 18 which can accommodate two elastic tubes 17 is formed in the pressing plate 11, and two elastic tubes 17 are accommodated in parallel in the concave groove 18 so that a part of each is projected from the pressing plate 11. Further, although the illustration is omitted, a pressure adjustment device for adjusting the inner pressure of each is connected to the two elastic tubes 17 in the same way as the above-described embodiment. As the elastic tube 17 of this embodiment, a tube having a cross-sectional shape shown in FIG. 4A is used but it is not restricted to this. For example, one having a cross-sectional shape shown in FIG. 3 or FIG. 4A can be used. It is also possible for the concave groove 18 to have a constant width from the bottom portion of the groove to the opening end, but in this embodiment, as shown in FIG. 5A, the concave groove 18 flares out from the vicinity of the opening toward the opening end.

In the contact apparatus of this embodiment, as shown in 5B, when the inner pressures of the two elastic tubes 17 are substantially equal to each other, at the time of the pressing of an FPC 12 by the pressing plate 11, the two elastic tubes 17 are displaced to the side in the flared portion of the concave groove 18, and therefore it is possible to eliminate looseness of the FPC 12 and impart tension.

Moreover, it is also possible to alternately change the inner pressures of the two elastic tubes 17. By alternately changing the inner pressures of the two elastic tubes 17, a so-called "wiping" function can be produced in the contact region between the elastic tube 17 and the FPC 12 and in the contact region between the conductive films 14 and the electrodes 4. Accordingly, the conductive films 14 and the electrodes 4 can be more reliably made electrically conductive.

FIGS. 6A to 6C and FIG. 7 show another embodiment of the present invention. In these figures, constituent elements similar to those of the above-described embodiment are given the same reference numerals. The contact apparatus 10 of this embodiment is not provided with the aforementioned elastic tube, but as seen from FIGS. 6A to 6C, convex portions 25 positioned at the back sides of the conductive films 14 are provided on the back side of the insulating film 13 of the FPC 12. In the case of this embodiment, it is important that one of the convex portions 25 and the pressing surface of the pressing plate 11 be formed by an elastic material which is more easily elastically deformed than the other. In this embodiment, the convex portions 25 are made of a rubber material such as a silicone rubber which is more easily elastically deformed than the pressing surface of the pressing plate 11 and are formed at the back side of the insulating film 13. On the other hand, the pressing plate 11 is made of a material such as glass having almost the same coefficient of linear expansion as that of the insulating substrate 2 of the liquid crystal display panel 1 in the same way as the above-described embodiment. The FPC 12 is fixed to the pressing plate 11 in the vicinity of the distance of contact between the conductive films 14 and the electrodes 4 as shown in FIG. 7.

Figure 6A:
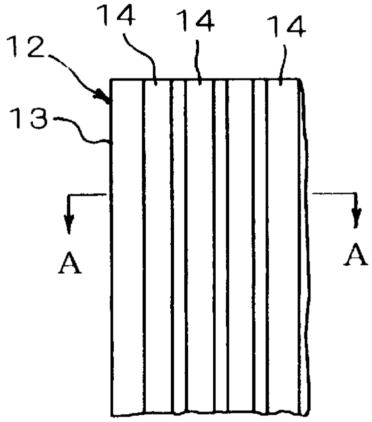
FIG. 6A is a front side view of principal parts of the flexible contact sheet according another embodiment of the present invention provided with convex portions on the back side of the flexible contact film.
Figure 6B:
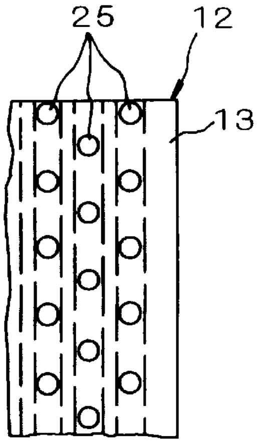
FIG. 6B is a back side view of the principal parts of the flexible contact sheet shown in FIG. 6A.
Figure 6C:
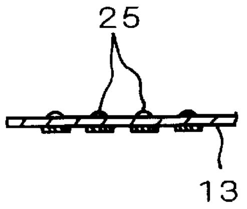
FIG. 6C is a cross-sectional view of the principal parts of the flexible contact sheet taken along a line A—A in FIG. 6A.

As shown in FIG. 6B, preferably a plurality of convex portions 25 are arranged on the back side of the insulating film 13 at the positions corresponding to the backs of the conductive films 14 along the length direction of the conductive films 14.

In this embodiment, the conductive films 14 arranged on the front side of the insulating film 13 of the FPC 12 are used as the contact terminals to be brought into contact with the electrodes 4 on the insulating substrate 2 of the liquid crystal display panel 1, and therefore contact terminals of a fine pitch distance corresponding to the fine pitch of the electrodes 4 of the liquid crystal display panel 1 can be formed at a low cost and with a high precision. Accordingly, an electric contact apparatus provided with a number of contact terminals corresponding to the number of the electrodes of the liquid crystal display panel I can be easily realized. Also, the conductive films 14 of the FPC 12 are resistant to short-circuits, poor conduction, etc. due to deformation and the breakage, and therefore the handling property and the durability are improved.

Further, the FPC 12 is pressed by the pressing plate 11 via the convex portions 25 provided on the back surface of the insulating film 13 and the convex portions 25 are positioned corresponding to the backs of the conductive films 14 in the distances of contact between the conductive films 14 and the electrodes 4, and therefore the pressing force by the pressing plate 11 can be made to concentratedly act upon the distance of contact between the conductive films 4 and the electrodes 4. Accordingly, a big contact pressure can be produced in the contact regions between the conductive films 14 and the electrodes 4 by a small pressing force.

In addition, the convex portions 25 positioned corresponding to the backs of the conductive films 14 are formed by a rubber material which is more easily elastically deformed than the pressing surface of the pressing plate 11, and therefore a uniform contact pressure can be ensured in the contact regions between the conductive films 14 and the electrodes 4 by utilizing the elasticity of the convex portions 25.

FIG. 8 shows an example of a modification of the embodiment shown in FIG. 7. In the figure, constituent elements similar to those of the embodiment of FIG. 7 are given the same reference numerals. This embodiment is characterized in that the pressing surface of the pressing plate 11 is formed by an elastic material which is more easily elastically deformed than the convex portions 25 positioned corresponding to the backs of the conductive films 14. Explaining this in further detail, the pressing plate 11 comprises a base plate portion 26 made of a material having substantially the same coefficient of linear expansion as that of the insulating substrate 2 of the liquid crystal display panel 1 and an elastic pressing portion 27 made of a rubber material formed in the form of films at parts of the pressing surface of this base plate portion 26. On the other hand, the convex portions 25 are made of a metal, hard resin, or the like and formed on the back side of the insulating film 13 of the FPC 12. Also, the FPC 12 is fixed on the base plate portion 26 of the pressing plate 11 in the vicinity of the distances of contact between the conductive films 14 and the electrodes 4 by bonding.

In the contact apparatus of this embodiment, the pressing force of the pressing plate 11 can be concentrated at the convex portions 25 and, at the same time, the contact pressure between the conductive films 14 and the electrodes 4 can be made uniform by utilizing the elasticity of the elastic pressing portion forming the pressing surface of the pressing plate 11. A pressing plate having a pressing surface which is more easily elastically deformed than the convex portions 25 provided on the back side of the insulating film 13 of the FPC 12 can be realized at a low cost.

Also, the base plate portion 26 of the pressing plate 11 is made of a material having substantially the same coefficient of linear expansion as that of the insulating substrate 2 of the liquid crystal display panel 1 and the FPC 12 is tightly fixed to the base plate portion 26 of the pressing plate 11 in the vicinity of the contact regions between the conductive films 14 and the electrodes 4, and therefore when the environmental temperature at the time of the display inspection of the liquid crystal display panel 1 is changed, the pitch of the conductive films 14 of the FPC 12 fixed to the base plate portion 26 of the pressing plate 11 can be made to substantially follow the change of the pitch of the electrodes 4 on the insulating substrate 2 of the liquid crystal display panel 1, and the electrically conductive state between the conductive films 14 and the electrodes 4 can be maintained . Accordingly, the display operation or display quality of the liquid crystal display panel 1 varying the environmental temperature can be inspected without obstacle.

The convex portions 25 in the embodiment of FIG. 7 and FIG. 8 mentioned above exhibit a substantially semispherical projectile shape, but as exemplified in FIGS. 9A, 9B, and 9C, it is also possible for the convex portions 25 to have for example a frustoconical shape, horizontal triangular block shape, conical shape, etc.

Figure 10A:
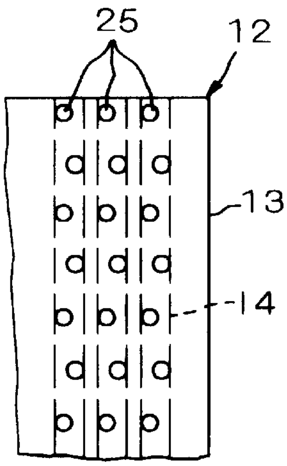
FIGS. 10A and 10B are plan views of principal parts showing examples of modifications of the state of arrangement of the convex portions at the back side of the insulating film of the flexible printed circuit board.
Figure 10B:
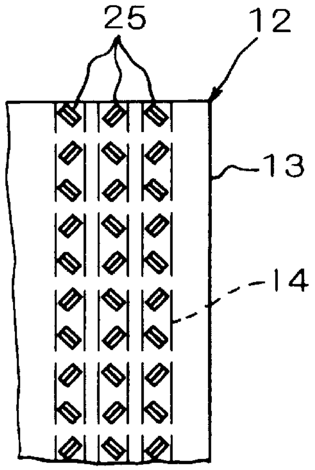

Also, in the embodiment shown in FIG. 6B, the convex portions 25 are arranged in one column along the length direction of the electrically conductive films 14, but as shown in FIGS. 10A and 10B, it is also possible for a plurality of convex portions 25 having various shapes to be arranged in a zigzag manner in the length direction of the conductive films 14.

Figure 11:
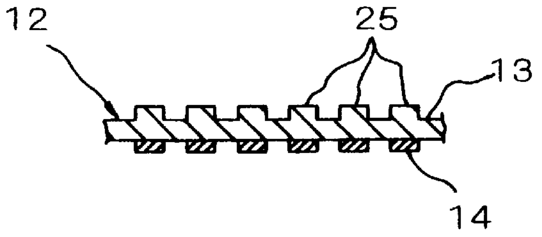
FIG. 11 is a longitudinal cross-sectional view of principal parts showing an embodiment of a flexible printed circuit board having a convex portions at the back side of the insulating film.

Further, as shown in FIG. 11, it is also possible for the back side of the insulating film 13 on which the conductive films 14 are formed to be formed in shape having the convex portions 25. In this case, preferably a plurality of convex portions 25 are arranged in the length direction of the conductive films 14 at positions corresponding to the back sides of the conductive films 14, but it is also possible for one convex portion 25 extending in the length direction of the conductive films 14 to be provided at a position corresponding to the backs of the conductive films 14. Note that, when the FPC 12 shown in FIG. 11 is used, it becomes necessary to form the pressing surface of the pressing plate 11 by a material which is more easily elastically deformed than the convex portions 25.

Figure 12:
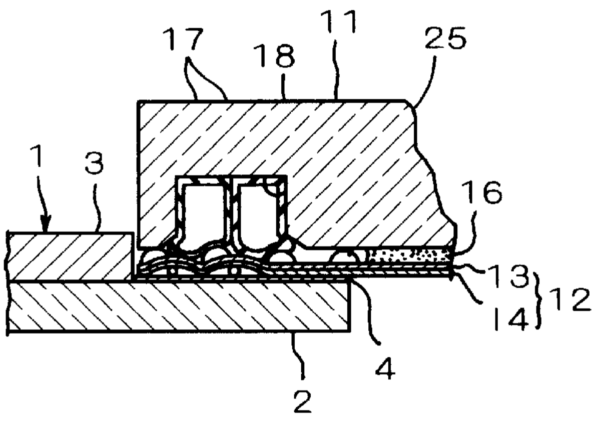
FIG. 12 is a longitudinal cross-sectional view of principal parts showing an embodiment of an electric contact apparatus provided with a pressing plate for holding the elastic tube and a flexible contact sheet having convex portions on the back side of the insulating film.

In above description, FIG. 1 through FIGS. 5A showed an embodiment using the elastic tube 17; and FIG. 6A through FIG. 11 showed an embodiment providing convex portions 25 on the back side of the insulating film 13 of the FPC 12, but as shown in FIG. 12, it is also possible to use an FPC 12 provided with convex portions 25 on the back side of the insulating film 13 and the pressing plate 11 holding the elastic tube 17 in combination. Note, in this case, desirably the convex portions 25 are formed by a material which less elastically deformed than the elastic tube 17.

In above description, an explanation was made of illustrated embodiments, but the present invention is not limited to the above-described embodiments. For example it is also possible to arrange a number of conductive films 14 corresponding to the number of the electrodes 4 on the insulating substrate 2 of the liquid crystal display panel 1 in one FPC. Also, the shape of the pressing plate, the shape of FPC and the arrangement, etc. can be changed in accordance with the arrangement of the electrodes of the liquid crystal display panel 1 to be inspected. Also, the contact apparatus of the present invention can be used not only for inspection of transmission type liquid crystal display panels, but also reflection type liquid crystal display panels.

As apparent from the above explanation, according to the present invention, an electric contact apparatus for inspecting a liquid crystal display panel which can be produced at a low cost, is excellent in durability and reliability of electrical conductivity, and in addition can easily and efficiently inspect the display operation or the quality of display of the entire display portion of the liquid crystal display panel can be provided.

What is claimed is:

1. An electric contact apparatus for engaging a liquid crystal display panel having a plurality of electrodes arranged in a direction on an insulating substrate, said electric contact apparatus comprising:

at least one flexible contact sheet having an insulating film which has a front side and a back side and also having a plurality of elongate conductive films which are formed on only said front side of said insulating film and arranged in parallel with each other along the direction of arrangement of said electrodes so that said plurality of conductive films are brought into contact with said electrodes, respectively;

a pressing plate, pressing at one side thereof at least a part of said back side of said insulating film of said flexible contact sheet against said insulating substrate to contact said conductive films of said flexible contact sheet with said electrodes; and means for locally increasing contact pressures at plurality of positions in each of a plurality of respective contact regions between said conductive films of said flexible contact sheet and said electrodes when said flexible contact sheet is pressed against said insulating substrate by said pressing plate.

2. The electric contact apparatus as set forth in claim 1, wherein said means for locally increasing contact pressures comprises at least one internally sealed elastic tube supported on said one side of said pressing plate and extending along the direction of arrangement of said conductive films so as to press locally a part of each contact region between said conductive films and said electrodes.

3. The electric contact apparatus as set forth in claim 2, wherein said pressing plate is formed with a groove extending along the direction of arrangement of said conductive films and wherein said elastic tube is accommodated in said groove so that a part thereof is projected from said one side of said pressing plate toward said flexible contact sheet.

4. The electric contact apparatus as set forth in claim 2, wherein said elastic tube is connected to pressure adjusting means for adjusting an inner pressure of said elastic tube.

5. The electric contact apparatus as set forth in claim 2, wherein said means for locally increasing contact pressures comprises two internally sealed elastic tubes which are adjacent to each other and extend along the direction of arrangement of said conductive films within said groove of said pressing plate so that a part of each is projected from said pressing plate toward said flexible contact sheet and presses locally a part of each contact region between said conductive films and said electrodes, and pressure adjusting means coupled to the two elastic tubes for adjusting an inner pressure of each of said elastic tubes.

6. The electric contact apparatus as set forth in claim 2, wherein the number of driving modules of said flexible contact sheets corresponds to the number of said liquid crystal display panel, and wherein a number of said conductive films corresponding to the number of electrodes for each driving module are formed on each flexible contact sheet.

7. The electric contact apparatus as set forth in claim 2, wherein a rough portion including convex portions of a finer pitch than the pitch of arrangement of said conductive films is formed on an outer surface of said elastic tube in a region abutting against said flexible contact sheet.

8. The electric contact apparatus as set forth in claim 2, wherein said pressing plate is made of a material having substantially the same coefficient of linear expansion as that of said insulating substrate of said liquid crystal display panel and wherein said flexible contact sheet is fixed to said pressing plate in the vicinity of said elastic tube.

9. The electric contact apparatus as set forth in claim 2, wherein a plurality of convex portions are provided on the back side of said flexible contact sheet at positions corresponding to the backs of said conductive films along the respective contact regions between said conductive films and said electrodes.

10. The electric contact apparatus as set forth in claim 1, wherein said means for locally increasing contact pressures comprises a plurality of convex portions arranged on said back side of said insulating film of said flexible contact sheet at positions corresponding to the backs of said conductive films along the respective contact regions between said conductive films and said electrodes, said convex portions and said one side of said pressing plate being made of first and second materials, respectively, one of said first and second materials being more easily elastically deformable than the other.

11. The electric contact apparatus as set forth in claim 10 wherein said first material of said convex portions is more easily elastically deformable than said second material, and said entire pressing plate is made of said second material which has substantially the same coefficient of linear expansion as that of said insulating substrate of said liquid crystal display panel, and wherein said flexible contact sheet is fixed to said pressing plate in the vicinity of the region of arrangement of said convex portions.

12. The electric contact apparatus as set forth in claim 10, wherein said second material of said one side surface of said pressing plate is more easily elastically deformable than said first material of said convex portions, and wherein said pressing plate comprises a base plate portion made of a material having substantially the same coefficient of linear expansion as that of said insulating substrate of said liquid crystal display panel, and an elastic film which forms said one side of said pressing plate and is fixed to said base plate portion at a region corresponding to the region of arrangement of said convex portions, said insulating film of said flexible contact sheet being fixed to the base plate portion of said pressing plate in the vicinity of said elastic film.

13. The electric contact apparatus as set forth in claim 10, wherein said second material of said one side of said pressing plate is more easily elastically deformable than said first material of said convex portions, and wherein said insulating film of said flexible contact sheet and said convex portions are formed in one piece.

14. The electric contact apparatus as set forth in claim 1 wherein said means for locally increasing contact pressures is positioned between said at least one flexible contact sheet and said pressing plate.

* * * * *